US008756384B2

(12) United States Patent
Kurita et al.

(10) Patent No.: US 8,756,384 B2
(45) Date of Patent: **\*Jun. 17, 2014**

(54) INFORMATION PROCESSING DEVICE AND INFORMATION PROCESSING METHOD FOR DATA RECOVERY AFTER FAILURE

(75) Inventors: Taro Kurita, Tokyo (JP); Toshiharu Takemura, Tokyo (JP)

(73) Assignee: Sony Corporation, Tokyo (JP)

(*) Notice: Subject to any disclaimer, the term of this patent is extended or adjusted under 35 U.S.C. 154(b) by 743 days.

This patent is subject to a terminal disclaimer.

(21) Appl. No.: 12/343,074

(22) Filed: Dec. 23, 2008

(65) Prior Publication Data

US 2009/0106582 A1 Apr. 23, 2009

Related U.S. Application Data

(63) Continuation of application No. 11/057,987, filed on Feb. 15, 2005, now Pat. No. 7,478,270.

(30) Foreign Application Priority Data

Feb. 23, 2004 (JP) .................................. 2004-045586

(51) Int. Cl.
*G06F 12/00* (2006.01)

(52) U.S. Cl.
USPC ............... 711/162; 711/161; 714/6.1; 714/14

(58) Field of Classification Search
USPC ............................. 711/161, 162; 714/6.1, 14
See application file for complete search history.

(56) References Cited

U.S. PATENT DOCUMENTS

| 4,888,686 | A | 12/1989 | Sinz et al. |
| 5,231,514 | A | 7/1993 | Nakamura |
| 5,557,777 | A | 9/1996 | Culbert |
| 5,608,684 | A * | 3/1997 | Reasoner et al. ............. 365/228 |
| 6,330,633 | B1 | 12/2001 | Kusakabe et al. |
| 6,401,179 | B1 * | 6/2002 | Park .............................. 711/165 |
| 6,662,265 | B1 | 12/2003 | Kessler et al. |
| 6,687,784 | B2 * | 2/2004 | Douniwa et al. .............. 711/103 |
| 2001/0049764 | A1 | 12/2001 | Lu et al. |
| 2002/0184436 | A1 * | 12/2002 | Kim et al. ..................... 711/103 |
| 2003/0033308 | A1 * | 2/2003 | Patel et al. ...................... 707/10 |
| 2003/0188220 | A1 | 10/2003 | Misra et al. |

FOREIGN PATENT DOCUMENTS

| JP | 05-282888 | 10/1993 |
| JP | 08-272698 | 10/1996 |
| JP | 10-124400 | 5/1998 |
| JP | 10-124403 | 5/1998 |
| JP | 10-240631 | 9/1998 |
| JP | 11-353241 | 12/1999 |
| JP | 2001-154926 | 6/2001 |
| JP | 2004-265275 | 9/2004 |

\* cited by examiner

*Primary Examiner* — Gurtej Bansal
(74) *Attorney, Agent, or Firm* — K&L Gates LLP

(57) ABSTRACT

An information processing device and information processing method including a management table that includes three pages. A pair of first and second pages is alternately used as a valid page and an invalid page to secure the data. The valid page is copied to a third page. Even when the power is shut off in the process of updating the page, at the next start time, the status of the data writing operation when the power is shut off is determined based on the validity and stability of the pages. Therefore, the data is restored without any corruption of valid page by using a proper restoring method.

24 Claims, 12 Drawing Sheets

FIG. 6

| FIG. 6A | FIG. 6B |
|---|---|

FIG. 6A

| STATUS | SEQUENCE | | PAGE A | PAGE B |
|---|---|---|---|---|
| STATUS ⑩-1 | | | VALID-CTC SMALL | (UNSTABLE) ALL 00 |
| STATUS ⑩-2 | | | VALID-CTC SMALL | (UNSTABLE) CRC ERROR |
| STATUS ⑩-3 | | | VALID-CTC SMALL | (UNSTABLE) ALL FF |
| STATUS ① | | START POINT FOR WRITING PAGE B | VALID-CTC SMALL | ALL FF |
| STATUS ②-1 | ↓ | | VALID-CTC SMALL | (UNSTABLE) ALL FF |
| STATUS ②-2 | ↓ | | VALID-CTC SMALL | (UNSTABLE) ALL 00 |
| STATUS ②-3 | | ERASE PAGE B | VALID-CTC SMALL | (UNSTABLE) CRC ERROR |
| STATUS ③ | | | VALID-CTC SMALL | ALL FF |
| STATUS ④-1 | ↓ | | VALID-CTC SMALL | (UNSTABLE) ALL FF |
| STATUS ④-2 | | | VALID-CTC SMALL | (UNSTABLE) ALL 00 |
| STATUS ④-3 | ↓ | | VALID-CTC SMALL | (UNSTABLE) CRC ERROR |
| STATUS ④-4 | ↓ | WRITE PAGE B | VALID-CTC SMALL | (UNSTABLE) VALID-CTC LARGE |
| STATUS ⑤ | | | VALID-CTC SMALL | VALID-CTC LARGE |
| STATUS ⑥-1 | | | VALID-CTC SMALL | VALID-CTC LARGE |
| STATUS ⑥-2 | | | VALID-CTC SMALL | VALID-CTC LARGE |
| STATUS ⑥-3 | | | VALID-CTC SMALL | VALID-CTC LARGE |
| STATUS ⑥-4 | | ERASE PAGE C | VALID-CTC SMALL | VALID-CTC LARGE |
| STATUS ⑦ | | | VALID-CTC SMALL | VALID-CTC LARGE |
| STATUS ⑧-1 | | | VALID-CTC SMALL | VALID-CTC LARGE |
| STATUS ⑧-2 | | | VALID-CTC SMALL | VALID-CTC LARGE |
| STATUS ⑧-3 | | | VALID-CTC SMALL | VALID-CTC LARGE |
| STATUS ⑧-4 | | WRITE PAGE C | VALID-CTC SMALL | VALID-CTC LARGE |
| STATUS ⑨ | | | VALID-CTC SMALL | VALID-CTC LARGE |
| STATUS ⑩-1 | | | (UNSTABLE) VALID-CTC SMALL | VALID-CTC LARGE |
| STATUS ⑩-2 | | | (UNSTABLE) ALL 00 | VALID-CTC LARGE |
| STATUS ⑩-3 | | | (UNSTABLE) CRC ERROR | VALID-CTC LARGE |
| STATUS ⑩-4 | | ERASE PAGE A | (UNSTABLE) ALL FF | VALID-CTC LARGE |
| STATUS ① | | START POINT FOR WRITING PAGE A | ALL FF | VALID-CTC LARGE |

| PAGE C (COPY) | SELECTED PAGE | RESTORING METHOD AND SEQUENCE AT START |
|---|---|---|
| COPY OF PAGE A | | |
| COPY OF PAGE A | | |
| COPY OF PAGE A | | |
| COPY OF PAGE A | | |
| COPY OF PAGE A | | "DETERMINING PATTERN 1" |
| COPY OF PAGE A | PAGE A | NONE |
| COPY OF PAGE A | | |
| COPY OF PAGE A | | |
| COPY OF PAGE A | | |
| COPY OF PAGE A | | |
| COPY OF PAGE A | | "DETERMINING PATTERN 3" |
| COPY OF PAGE A | PAGE A | 1) DETERMINE THAT PAGE C IS EQUAL TO PAGE A, |
| (UNSTABLE) COPY OF PAGE A | | AND COPY PAGE A TO PAGE C   2) ERASE PAGE B |
| (UNSTABLE) ALL 00 | | |
| (UNSTABLE) CRC ERROR | | |
| (UNSTABLE) ALL FF | | "DETERMINING PATTERN 2" |
| ALL FF | PAGE B | 1) COMPARE PAGE A WITH PAGE B, AND COPY PAGE WITH |
| (UNSTABLE) ALL FF | | LARGE CTC TO PAGE C   2) ERASE PAGE WITH SMALL CTC |
| (UNSTABLE) ALL 00 | | |
| (UNSTABLE) CRC ERROR | | |
| (UNSTABLE) COPY OF PAGE B | | "DETERMINING PATTERN 3" |
| COPY OF PAGE B | PAGE B | 1) DETERMINE THAT PAGE C IS EQUAL TO PAGE B, |
| COPY OF PAGE B | | AND COPY PAGE B TO PAGE C   2) ERASE PAGE A |
| COPY OF PAGE B | | |
| COPY OF PAGE B | PAGE B | "DETERMINING PATTERN 1" |
| COPY OF PAGE B | | NONE |
| COPY OF PAGE B | | |

FROM FIG. 6A

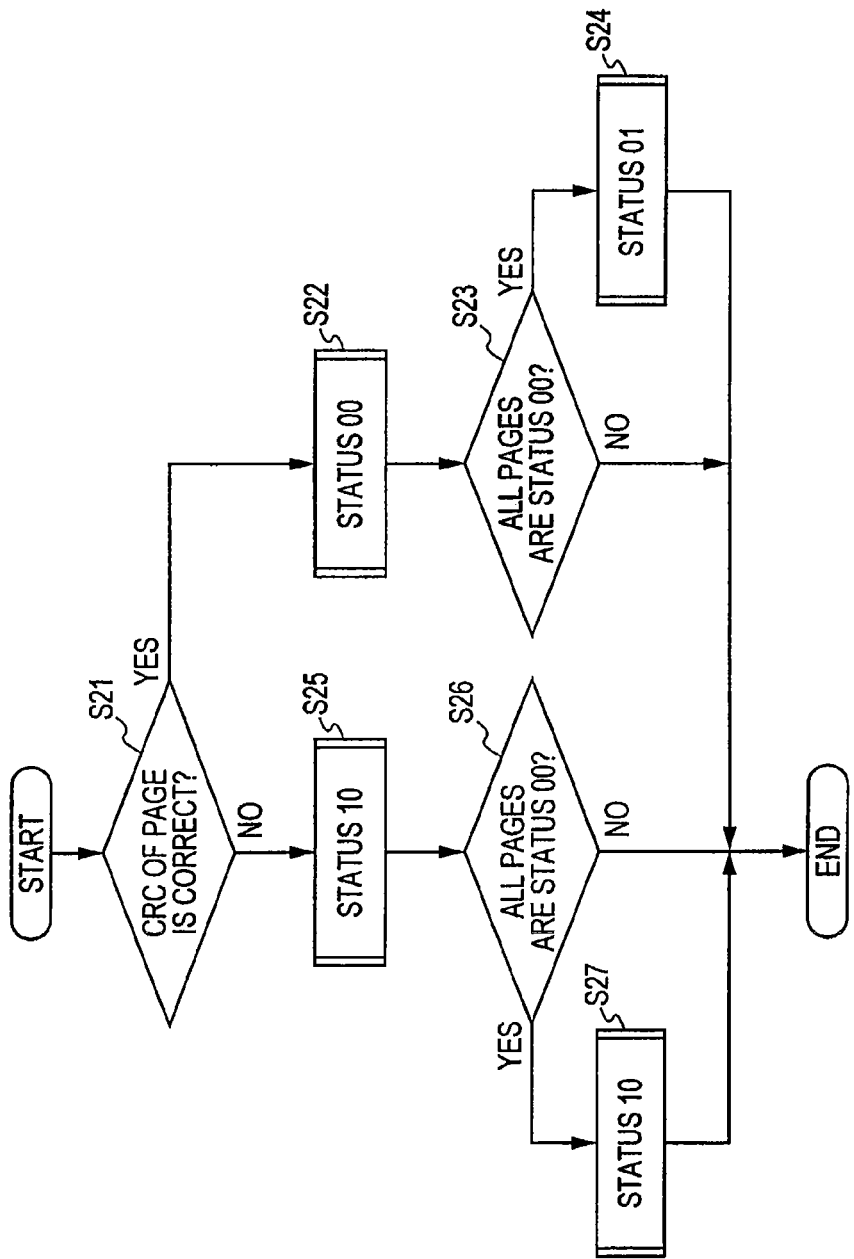

INFORMATION PROCESSING DEVICE AND INFORMATION PROCESSING METHOD FOR DATA RECOVERY AFTER FAILURE

CROSS REFERENCE TO RELATED APPLICATIONS

The present application is a continuation of U.S. patent application Ser. No. 11/057,987, filed on Feb. 15, 2005, which issued as U.S. Pat. No. 7,478,270 on Jan. 13, 2009, which claims priority to Japanese Patent Application No. P2004-045586 filed on Feb. 23, 2004, the disclosure of which is incorporated herein by reference.

BACKGROUND

The present invention relates to an information processing device, an information processing method, and a computer program, in which data is written to a memory. More particularly, the present invention relates to an information processing device, an information processing method, and a computer program, in which data is written to a memory for writing the data after erasing the data.

Further, the present invention relates to an information processing device, an information processing method, and a computer program, in which a valid page is restored without corruption at the next start time, even when power is shut-off during erasing and writing data to the page in a memory. More particularly, the present invention relates to an information processing device, an information processing method, and a computer program to preferably prevent the corruption of data in a page which is unstable due to the shut-off operation of power during erasing and writing the data in the page, even when power is shut-off again during writing the data to the page.

A non-contact and close communication system, typically, an IC card is widely spread because it is easy in the operation. For example, the IC card stores personal identification code, another personal identification (ID) information, valid information such as electronic ticket, and the like, thereby authenticating a visitor and a passenger at a cash dispenser, an entrance of a concert hole, or a ticket gate of a station.

The above-mentioned radio communication is generally based on the principle of electromagnetic induction. That is, the structure in this case includes an IC card having a memory function and a card reader/writer for writing/reading data to/from the memory in the IC card to access the data and forms one transformer serving as one system having a loop coil serving as a primary coil on the IC card side and an antenna serving as a secondary coil on the card reader/writer side. Further, the card reader/writer sends power and information to the IC card, similarly with the operation of electromagnetic induction, and the IC card is driven by the supplied power to send a response to a query signal from the card reader/writer. Therefore, the IC card itself does not need any driving power supplies such as a battery.

In the general use of IC card, a user passes the IC card through the card reader/writer. The card reader/writer always poles the IC card and then finds an external IC card, thereby starting the communication between the IC card of the card reader/writer and the external IC card.

Recently, another IC card having a memory of a relatively large capacity appears in association with the improvement of miniaturization technology. In the IC card with the large-capacity memory, a file system is developed on a memory space and a plurality of application is simultaneously stored, thereby using one IC card for a plurality of application. For example, the one IC card stores the plurality of application such as electronic money for electronic payment and electronic ticket for entrance to a specific concert hole. Here, the electronic money or electronic ticket means a system for electronic payment via electronic data issued in accordance with a fund provided by the user or the above-mentioned electronic data.

Basically, the IC card does not provide the driving power supply such as a battery as mentioned above. Therefore, a non-volatile memory, e.g., an EEPROM (Electrically Erasable & Programmable ROM) is used as the memory to continuously keep data even without any power.

When the IC card is apart from the card reader/writer or electromagnetic waves are not received due to another reason in the use of IC card, the driving power is not sufficiently supplied. For example, the power is shut-off during writing the data to the memory in the IC card, the writing operation normally does not end. As a consequence, data block in the process of writing operation is unstable and, when the power is shut-off again, the data in the data block is corrupted.

In order to solve the data corruption due to the shut-off operation of power, additional data may be written to a data block except for the block which stores the previously-written data. In this case, since the writing operation of additional data does not corrupt the previously-written data, the unavailable status of IC card is prevented in the worst case.

In the case of updating data stored in a block B1 in a memory (rewriting the data stored in the block B1 to another data), additional data is written to the block B1 (overwritten to the already-stored data), the additional data is not completely written when the power supplied to the IC card is not sufficient during writing the data. Further, the data stored in the block B1 is corrupted. For example, the IC card is not available when the data stored in the block B1 indicates the money left of electronic money and additional data indicating the remaining money upon subtracting the price of additional shopping.

Then, the additional data to be written to the block B1 is written to another block B2 different from the block B1. In this case, the data in the memory is corrupted during writing the additional data in the block B2, the additional data is not completely written. Although the complete writing operation is not effective, at least the corruption of data stored in the block B1 is prevented. Finally, after ending the writing operation to the block B2, the data stored in the block B1 is erased. Further, another addition data is supplied and then it is written to a block (e.g., block B1) different from the block B2.

In addition to the data area for storing data to be stored, the memory space in the IC card has a management table which manages the physical arrangement of data blocks forming the data area. Here, the management table corresponds to an FAT (File Allocation Table) which manages the physical arrangement of data (e.g., sectors) based on the unit on a file space in a file system of MS-DOS (Microsoft-Disk Operating System (registered trademark)) widely-known in the computer field. In the specification, the management table in the non-volatile memory is also referred to as "root table". Both the shut-off operation of power during writing the data to the IC card and the data corruption affect the serious influence on the root table as well as the data area.

The power is shut-off during writing the data to the page in the root table, the page is unstable, the data is corrupted, and then arrangement information is lost. Therefore, the data area is not accessed. In other words, although the data corruption in the root table does not results in the data corruption in the data area, the IC card is not available.

In the case of a memory device which performs the writing operation without any operation and a bit, not serving as a writing target, does not become zero even upon shutting-off the power during the writing operation, the above-mentioned problem of data corruption is not caused. That is, upon rewriting the data to the unstable page which is not normally written, the power is shut-off again and then the data is not corrupted.

However, in many recent non-volatile memories, the page is necessarily erased once and is written for update. In this case, upon rewriting the unstable page which is not normally written, the power is shut-off again and then the data in the page is corrupted.

To solve unexpected shut-off operation of power in the erasing and writing operation, the root table comprises two pages serving as a pair and the two pages are alternately used as a valid page and an invalid page to secure the data. See, Japanese Unexamined Patent Application Publication No. 11-25003.

Hereinbelow, a description is given of the principle of data erasing and writing operation in the root table comprising the two pages with reference to FIGS. 10A to 10C. Incidentally, the root table shown in FIGS. 10A to 10C comprises two pages A and B serving as a pair.

Referring to FIG. 10A, the data has already been stored in the page A serving as one page of the root table, and the data is erased on the page B serving as the other page.

In the case of writing additional data, referring to FIG. 10B, the additional data is written to the page B which does not record any data so as to prevent the corruption of previously-written data. After ending the data writing operation, referring to FIG. 10C, the entire data recorded to the page A is erased.

However, in the case of the root table comprising the two pages, the power is shut-off during the writing operation upon rewriting the data to the unstable page, the data in the unstable page might be corrupted.

In the middle of FIGS. 10A and 10B, the data in the page becomes stable during writing the data to the page B (refer to FIG. 11). The power is shut-off at this step and then it is not specified even by later referring to the data storage contents or status to the pages A and B, at which step during erasing or writing the data to the page B the writing operation stops. Therefore, the best recovery is determined.

Further, in the middle of FIGS. 10B and 10A, the data in the page becomes unstable during erasing the data to the page A (refer to FIG. 12). The power is shut-off at this step and then it is not specified even by later referring to the data storage contents or status to the pages A and B, at which step during erasing or writing the data to the page A the writing operation stops. Therefore, the best recovery is determined.

For example, in the root table including the two pages as a pair, any of the pages has a priority to limit the recovery. The page A has a priority and the data in the page A is copied to the page B for recovery. However, when the page A is unstable in this case, the data both on the pages A and B might be unstable.

The data corruption due to the unexpected shut-off operation of power during erasing/writing the data is not limited to the non-contact communication device such as the IC card. The same problem exists in a mobile phone or another information device having the erasable non-volatile memory when the external shock comes during erasing/writing the data and a battery serving as a main power supply is unexpectedly detached, or when a memory cartridge is detached from the device main body during erasing/writing the data.

SUMMARY

The present invention relates to an information processing device, an information processing method, and a computer program, in which data is written to a memory. More particularly, the present invention relates to an information processing device, an information processing method, and a computer program, in which data is written to a memory for writing the data after erasing the data.

Further, the present invention relates to an information processing device, an information processing method, and a computer program, in which a valid page is restored without corruption at the next start time, even when power is shut-off during erasing and writing data to the page in a memory. More particularly, the present invention relates to an information processing device, an information processing method, and a computer program to preferably prevent the corruption of data in a page which is unstable due to the shut-off operation of power during erasing and writing the data in the page, even when power is shut-off again during writing the data to the page.

The present invention provides in an embodiment an information processing device, an information processing method, and a computer program, in which data is preferably written to a memory such as a non-volatile memory, for writing the data after erasing the data once.

Further, the present invention provides in an embodiment an information processing device, an information processing method, and a computer program, in which a valid page in a memory is restored without corruption at the next start time even when the power is shut-off during erasing/writing data in the page.

Furthermore, the present invention provides in an embodiment an information processing device, an information processing method, and a computer program, in which the data corruption is preferably prevented even when the power is shut-off during erasing/writing management data for managing arrangement information in a data area in a memory.

In addition, the present invention provides in an embodiment an information processing device, an information processing method, and a computer program, in which the corruption of data in a page is preferably prevented even when the power is shut-off again during writing the data in the page which becomes unstable due to the shut-off operation of power during erasing/writing the data in the page.

According to an embodiment of the present invention, in an information processing device for controlling a data writing operation to a memory for writing data after erasure thereof, the memory comprises a data area and a page management table of first to third pages for managing arrangement information of the data area, and the information processing device includes:

page updating means which erases and writes valid arrangement information to one of the first and second pages in accordance with the data update of the data area;

valid page determining means which determines whether or not the first and second pages are valid;

page copying means which erases said third page and writes, to said third page, in a data page that is determined as valid by the valid page determining means; and page erasing means which erases the page that is determined as invalid by the valid page determining means.

When one of the first and second pages stores valid arrangement information, the page updating means erases the other page and writes new arrangement information to the other page of the first and second pages in response to the data update of the data area.

The first and second pages have a latest-information field indicating whether or not the storage contents thereof are latest and a valid-information field indicating whether or not the data writing operation of the arrangement information and the latest information normally ends. The valid page determining means determines which page is valid as a management table by referring to the latest-information field and the valid-information field of the first and second pages. For example, when one of the first and second pages is valid, the valid page determining means determines that the valid page is valid as the management table. When both the first and second pages are valid, the latest information is referred to and the valid page determining means determines that one of the first and second pages having larger latest information is valid as the management table.

According to an embodiment of the present invention, the management table for managing the arrangement information of the data area of the memory comprises three first to third pages. A pair of the first and second pages is used as a valid page and an invalid page, respectively to secure the data. In addition, the valid page is copied to the third page.

In this case, when the power is shut off in the process of updating the data in the page, at the next start time, it is determined, by referring to the validity and stability of the first to third pages, at which state of data writing operation the power is shut off. Since the appropriate restoring method is determined for the determined stage for writing the data, the data in the page is restored without corruption of valid page.

When one of the first and second pages is valid and stable and a copy of a valid one of the first and second pages is written to the third page, it is determined that the data is interrupted at the stage from the erasure of an invalid one of the first and second pages to a rewriting operation to the valid page. In this case, it is determined that one of the first and second pages whose copy is written to the third page is valid and the valid page is restored.

Further, when one of the first and second pages is valid and stable and the third page is invalid, the page copying means determines that the data is interrupted at the stage of erasing and writing the data to the third page. In this case, the restoring means determines that the page determined as a valid page by the valid page determining means is valid among the first and second pages, and restores the valid page.

Furthermore, when both first and second pages are valid and one of the first and second pages is unstable, it is determined based on as which one of the first and second pages the third page is equal to, the data is interrupted just after starting the update of the third page or just before the end of update thereof. In this case, the page determined as a valid page by the page determining means among the first and second pages is copied to the third page, and the page is determined as an invalid one of the first and second pages is erased.

According to another embodiment of the present invention, in a computer-readable computer program for executing processing for controlling a data writing operation to a memory for a writing operation after erasure thereof on a computer system, the memory comprises a management table comprising three first to third pages for managing arrangement information of a data area, and the computer program includes:

a page updating step of erasing and writing with valid arrangement information of one of said first and second page in accordance with the data update of the data area;

a valid page determining step of determining whether or not the first and second pages are valid;

a page copying step of erasing said third page and writing, to said third page, data in the page that is determined as a valid page by the valid page determining step; and a page erasing step of erasing the page that is determined as an invalid page by the valid page determining step.

The computer program according to the second aspect of the present invention is readable by a computer to realize predetermined processing on the computer system. In other words, the computer program according to the second aspect of the present invention is installed to the computer system, and thus the cooperative operation is exhibited on the computer system and it is possible to obtain the same advantages and operations as those according to the first aspect of the present invention.

Additional features and advantages of the present invention are described in, and will be apparent from, the following Detailed Description of the Invention and the figures.

BRIEF DESCRIPTION OF THE FIGURES

FIGS. 6A and 6B are diagrams showing switching statuses of the valid page as the management table and starting processing when the power is shut off in each status;

FIG. 9 is a flowchart showing the processing sequence for determining the statuses of the pages A to C.

DETAILED DESCRIPTION

The present invention relates to an information processing device, an information processing method, and a computer program, in which data is written to a memory. More particularly, the present invention relates to an information processing device, an information processing method, and a computer program, in which data is written to a memory for writing the data after erasing the data.

Further, the present invention relates to an information processing device, an information processing method, and a computer program, in which a valid page is restored without corruption at the next start time, even when power is shut-off during erasing and writing data to the page in a memory. More particularly, the present invention relates to an information processing device, an information processing method, and a computer program to preferably prevent the corruption of data in a page which is unstable due to the shut-off operation of power during erasing and writing the data in the page, even when power is shut-off again during writing the data to the page.

Hereinbelow, a description is given of various embodiments of the present invention with reference to the drawings.

Figure 1:
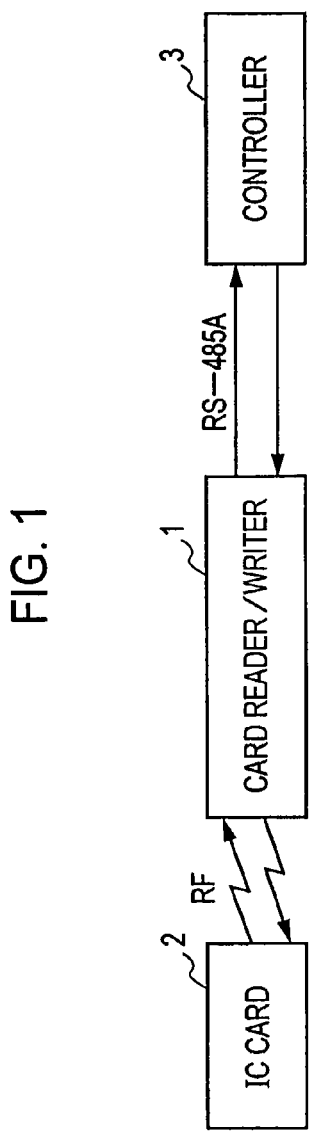
FIG. 1 is a diagram showing schematic structure of a non-contact communication system according to an embodiment of the present invention.

FIG. 1 schematically shows the structure of a non-contact IC card communication system according to an embodiment of the present invention.

The non-contact card system includes: a card reader/writer 1; an IC card 2; and a controller 3, and data is received/transmitted by electromagnetic waves in the non-contact status between the card reader/writer 1 and the IC card 2. That is, the card reader/writer 1 sends a predetermined command to the IC card 2, and the IC card 2 performs processing in response to the received command. Then, the IC card 2 sends response data corresponding to the processing result to the card reader/writer 1.

The card reader/writer 1 is connected to the controller 3 via a predetermined interface (e.g., in conformity with RS-485A standard). The controller 3 supplies a control signal to the card reader/writer 1 to perform predetermined processing.

Figure 2:
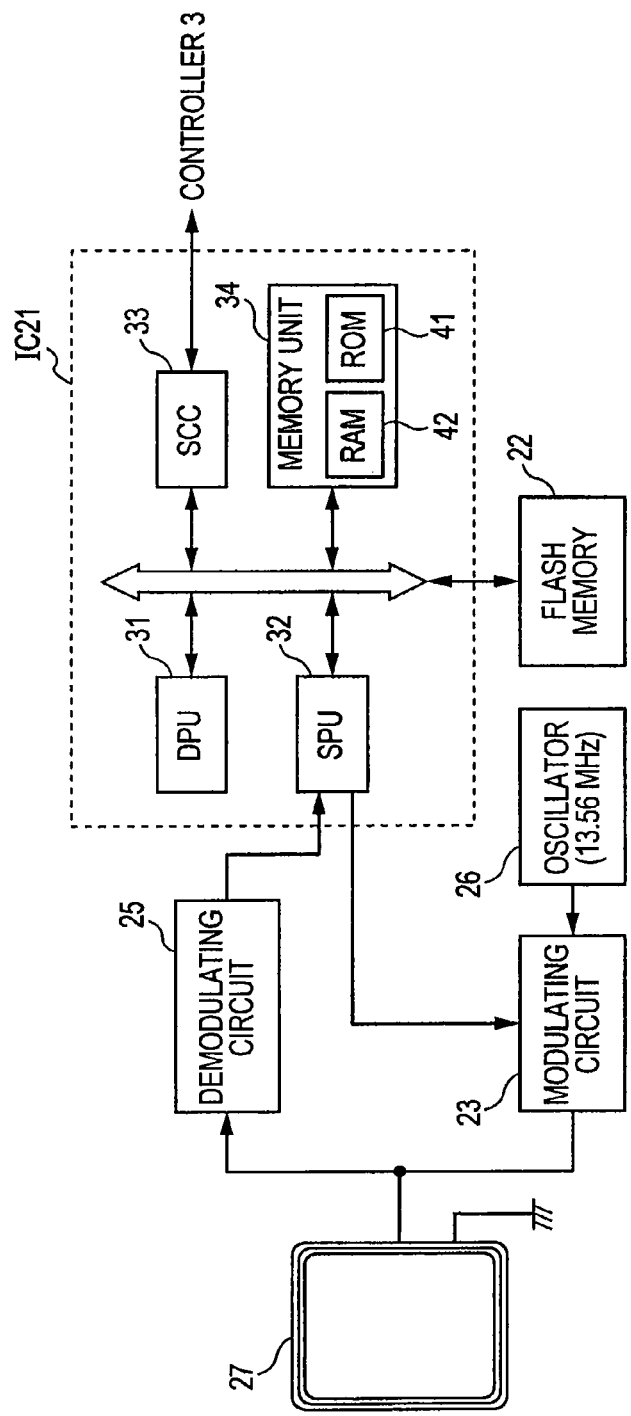
FIG. 2 is a diagram showing a structure example of a card reader/writer.

FIG. 2 shows a structure example of the card reader/writer 1 shown in FIG. 1.

An IC chip module 21 comprises: a DPU (Data Processing Unit) 31 for data processing; an SPU (Signal Processing Unit) 32 for processing a receiving signal from the IC card 2 and a sending signal to the IC card 2; an SCC (Serial Communication Controller) 33 for communication with the controller 3; and a memory unit 34 including a ROM unit 41 for storing in advance information necessary for data processing and a RAM unit 42 for temporarily storing operation data in the process of processing. The functional modules are connected to each other via buses. The buses are connected to a flash memory 22 for storing predetermined data.

The DPU 31 outputs a sending command to the IC card 2 to the SPU 32, receives response data received from the IC card 2 from the SPU 32, and performs predetermined data processing.

The SPU 32 modulates the data by BPSK (BiPhase Shift Keying; Manchester coding) in response to the sending command to the IC card 2, then, outputs the modulated data to the modulating circuit 23, receives the response data from the IC card 2 from the demodulating circuit 25, and performs predetermined demodulation of BPSK of the data.

The modulating circuit 23 ASK (Amplitude Shift Keying) modulates carriers with a predetermined frequency (e.g., 13.56 MHz) supplied from an oscillator 26 by using the data supplied from the SPU 32, and outputs the produced modulated waves from the antenna 27 serving as electromagnetic waves to the IC card 2. In this case, the modulating circuit 23 ASK-modulates the data by setting the degree of modulation to less than 1. That is, even if the data is at the low level, the maximum amplitude of the modulated waves is not zero.

The demodulating circuit 25 demodulates the modulated waves (ASK modulated waves) received via the antenna 27, and outputs the demodulated data to the SPU 32.

Figure 3:
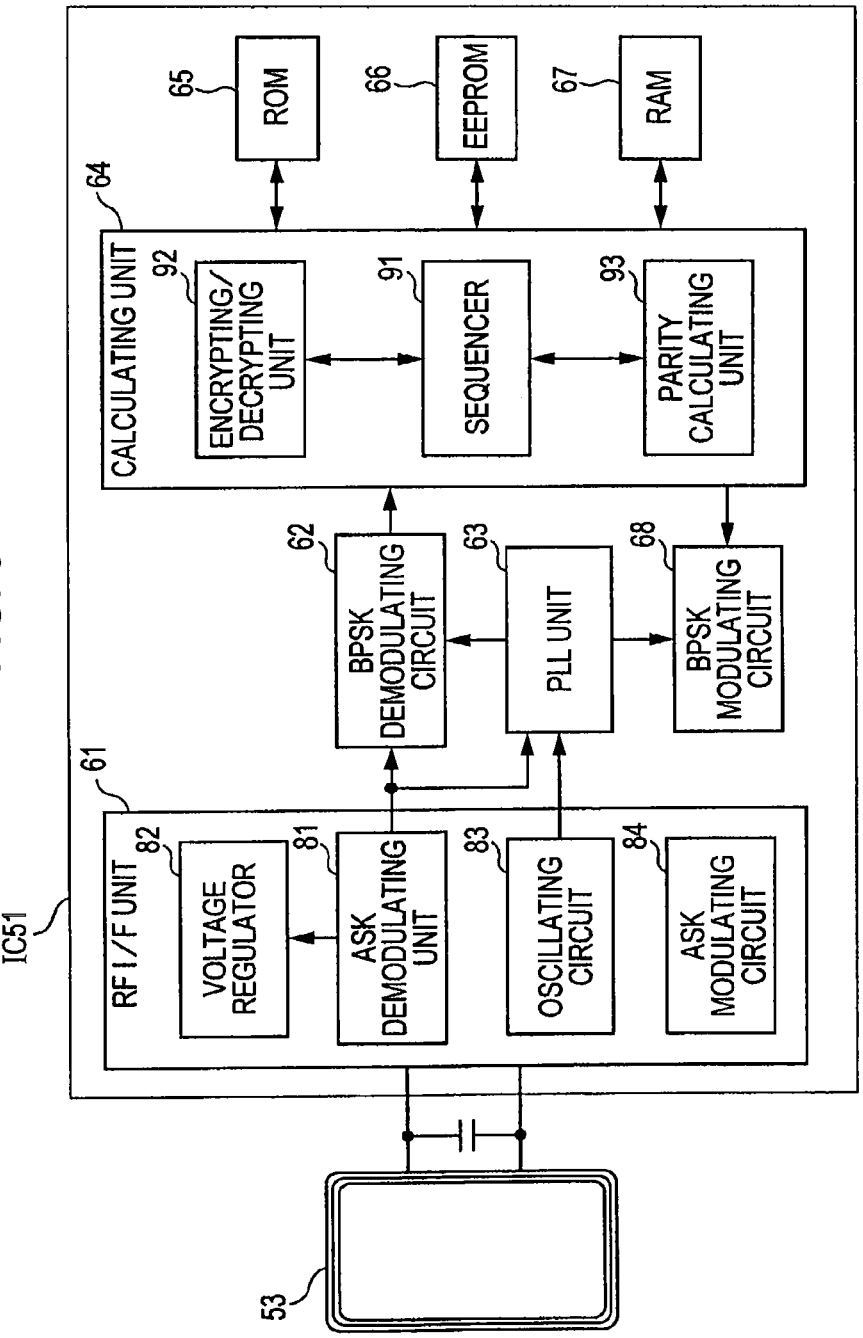
FIG. 3 is a diagram showing a structure example of a IC card.

FIG. 3 shows a structure example of the IC card 2 shown in FIG. 1. The IC card 2 comprises an IC chip module 51 and an antenna 53 on the loop.

The IC chip module 51 receives the modulated waves sent from the card reader/writer 1 via the antenna 53. The capacitor 52 and the antenna 53 form an LC circuit, thereby tuning (resonating) the signals to the electromagnetic waves with a predetermined frequency (carrier frequency).

The IC chip module 51 includes: an RF interface (I/F) unit 61 and a calculating unit 64. The RF interface unit 61 comprises: an ASK demodulating unit 81; a voltage regulator 82; an oscillating circuit 83; and an ASK modulating circuit 84. The ASK demodulating unit 81 detects and demodulates the ASK modulated waves received via the antenna 53, and outputs the data after demodulation to the BPSK demodulating circuit 62 and a PLL (Phase Locked Loop) unit 63. The voltage regulator 82 stabilizes the signal detected by the ASK demodulating unit 81, and supplies the stabilized signal as DC current to the circuits.

In the RF interface unit 61, the oscillating circuit 83 oscillates a signal with the same frequency as a clock signal of the data, and outputs the signal to the PLL unit 63. The ASK modulating circuit 84 fluctuates the load of the antenna 53 serving as the power supply of the IC card 2, corresponding to the data supplied from the calculating unit 64 (for example, turns on/off a predetermined switching element in accordance with the data and connects the predetermined load in parallel with the antenna 53 only when the switching element is on), thereby ASK modulating the modulated waves received via the antenna 53 and sending the modulating component to the card reader/writer 1 via the antenna 53. Upon sending the data from the IC card 2, the card reader/writer 1 has a constant maximum amplitude of the modulated waves to the outputted, and the modulated waves are ASK modulated by fluctuating the load of the antenna 53. A terminal voltage of the antenna 27 in the card reader/writer 1 is fluctuated.

The PLL unit 63 produces a clock signal synthesized with the data by using the data supplied from the ASK demodulating unit 81, and outputs the clock signal to the BPSK demodulating circuit 62 and the BPSK modulating circuit 68.

The BPSK demodulating circuit 62 demodulates the data (decodes the Manchester code) in accordance with the clock signal supplied from the PLL unit 63 when the data demodulated by the ASK demodulating unit 81 is BPSK modulated, and outputs the demodulated data to the calculating unit 64.

The calculating unit 64 decodes the data by an encrypting/decrypting unit 92 when the data supplied from the BPSK demodulating circuit 62 is encrypted and then a sequencer 91 processes the data. On the contrary, when the data supplied from the BPSK demodulating circuit 62 is not encrypted, it is directly supplied to the sequencer 91 not via the encrypting/decrypting unit 92.

The sequencer 91 processes the data corresponding to the supplied command. The sequencer 91 writes/reads the data to/from an EEPROM (Electrically Erasable and Programmable ROM) 66.

A parity calculating unit 93 of the calculating unit 64 calculates Read Solomon code serving as a parity based on the data stored in the ROM 65 and the data stored in the EEPROM 66. Further, the calculating unit 64 performs predetermined processing by the sequencer 91 and then outputs response data corresponding to the processing (data to be sent to the card reader/writer 1) to the BPSK modulating circuit 68.

The BPSK modulating circuit 68 BPSK modulates the data supplied from the calculating unit 64, and outputs the data after modulation to the ASK modulating circuit 84 in the RF interface unit 61.

The ROM 65 always stores a processing program to be executed by the sequencer 91 and another necessary data. The RAM 67 temporarily stores operation data in the processing of the sequencer 91.

The EEPROM 66 is a non-volatile memory, and is used for storing various application such as electronic money for electronic payment and electronic ticket for entrance to a specific concert hole on the IC card 2. Since the IC card 2 basically does not have any driving power supplies such as a battery, the IC card 2 ends the communication with the card reader/writer 1 and then uses a non-volatile memory including the EEPROM 66 for continuously holding the data even after stopping the power supply and when power is not supplied.

Next, a description is given of data reception/transmission between the card reader/writer 1 and the IC card 2.

The card reader/writer 1 radiates predetermined electromagnetic waves from the antenna 27, monitors the load of the antenna 27, and is waited until detecting the change in load due to the close status of the IC card 2. The card reader/writer 1 may radiate the electromagnetic waves ASK modulated by data with a predetermined short pattern and may perform processing (poling) for repeating the call to the IC card 2 until a response from the IC card 2 is received for a predetermined time period.

The card reader/writer 1 detects the close status of the IC card 2, then, the SPU 32 in the card reader/writer 1 BPSK modulates the data to be sent to the IC card 2 (command corresponding to processing executed by the IC card 2 or data written to the IC card 2) by using rectangular waves with a predetermined frequency (e.g., double frequency of the clock frequency of data) serving as carriers, and outputs the produced modulated waves (BPSK modulating signal, namely, Manchester code) to the modulating circuit 23.

In the BPSK modulation, the data corresponds to the change in phase of modulated waves by using the differential conversion. In this case, even if the BPSK modulating signal is inverted, it is demodulated to the original data and therefore the polarity of modulated waves is not necessarily considered.

The modulating circuit 23 ASK modulates the predetermined carriers with the degree of modulation (maximum amplitude of data signal/maximum amplitude of carriers) that is less than 1 (e.g., 0.1), and sends the produced modulated waves (ASK modulated waves) to the IC card 2 via the antenna 27.

Without sending operation, the modulating circuit 23 produces the modulated waves at the high level of two high level and low level of a digital signal.

In the IC card 2, the LC circuit comprising the antenna 53 and the capacitor 52 partly converts the electromagnetic waves radiated by the antenna 27 in the card reader/writer 1 into an electric signal, and outputs the electric signal (modulated waves) to the RF interface unit 61 in the IC chip module 51. The ASK demodulating unit 81 in the RF interface unit 61 detects the envelop by commutating and smoothing the modulated weaves, supplies the above-produced signal to a voltage regulator 82, suppresses the DC component of the signal, extracts a data signal, and outputs the data signal to the BPSK demodulating circuit 62 and the PLL unit 63.

The voltage regulator 82 stabilizes the signal supplied from the ASK demodulating unit 81, produces DC power, and supplies the power to the circuits.

A terminal voltage VO of the antenna 53 in this case is as follows.

$$V0 = V10(1+k \times Vs(t))\cos(\omega t),$$

where $V10 \cos(\omega t)$: carrier k: degree of modulation; and
Vs(t): data to be outputted by SPU 32.

A voltage VLR at the low level of a voltage V1 after commutation of the ASK demodulating unit 81 is as follows.

$$VLR = V10(1+k \times (-1)) - Vf$$

Here, reference symbol Vf denotes the reduction in voltage at a diode forming a commutating circuit for commutating and smoothing operation in the ASK demodulating unit 81, generally, 0.7V.

The voltage regulator 82 receives the signal commutated and smoothed by the ASK demodulating unit 81, stabilizes the signal, and supplies the signal serving as DC power to the circuits including the calculating unit 64. Since the degree k of modulation of the modulated waves is less than 1, the voltage fluctuation after commutation (differential between the high level and the low level) is small. Therefore, the voltage regulator 82 easily produces DC power.

When the modulated waves with the degree k of modulation is 5% are received so that the voltage V10 is 3V or more, the low-level voltage VLR after commutation is 2.15 (=3×(1−0.05)−0.7) V or more and thus the voltage regulator 82 supplies a sufficient voltage serving as power to the circuits. In this case, an amplitude (2×k×V10) serving as a peak-to-peak value) of the AC component (data component) of the voltage V1 after commutation is 0.3 (=20.05×3) V or more and thus the ASK demodulating unit 81 demodulates the data with a sufficiently high S/N ratio.

The data is communicated with a low error-rate (high S/N ratio) by using the ASK modulated waves with the degree k of modulation less than 1, and sufficient DC current serving as power is supplied to the IC card 2.

The BPSK demodulating circuit 62 receives the data signal (BPSK modulating signal) from the ASK demodulating unit 81, demodulates the data signal in accordance with the clock signal supplied from the PLL unit 63, and outputs the demodulated data to the calculating unit 64.

In the calculating unit 64, the encrypting/decrypting unit 92 decrypts the encrypted data supplied from the BPSK demodulating circuit 62 and then supplies the data (command) to the sequencer 91 for processing. After sending the data to the IC card 2, the card reader/writer 1 is waited while sending the data having a value as 1, until receiving the response to the data transmission. For the time period, the IC card 2 receives the modulated waves with a constant maximum amplitude.

The sequencer 91 outputs the data to be sent to the card reader/writer 1 to the BPSK modulating circuit 68. The BPSK modulating circuit 68 BPSK modulates the data (encodes the data to the Manchester code), similarly to the SPU 32 in the card reader/writer 1 and then outputs the modulated waves to the ASK modulating circuit 84 in the RF interface unit 61.

The ASK modulating circuit 84 fluctuates the load connected to both ends of the antenna 53 by using the switching element. That is, the ASK modulating circuit 84 fluctuates the load in accordance with the data form the BPSK modulating circuit 68, thereby ASK modulating the received modulated waves in accordance with the data to be sent. Thus, the terminal voltage of the antenna 27 in the card reader/writer 1 is fluctuated and the data is sent to the card reader/writer 1.

The modulating circuit 23 in the card reader/writer 1 continues the transmission of the data with a value as 1 (high level) in the data reception from the IC card 2: The demodulating circuit 25 detects the data sent from the IC card 2 based on the fine fluctuation (e.g., several tens microvolt) of the terminal voltage of the antenna 27 that is electromagnetically connected to the antenna 53 of the IC card 2.

Further, the demodulating circuit 25 demodulates the detected signal (ASK modulated waves) by an amplifier with high gain and outputs the above-obtained digital data to the SPU 32. The SPU 32 demodulates the data (BPSK modulating signal), and outputs the demodulated signal to the DPU 31. The DPU 31 processes the data from the SPU 32, and determines based on the processing result whether or not the communication ends.

When it is determined that the communication is executed again, the communication is established between the card reader/writer 1 and the IC card 2 as mentioned above. On the contrary, when it is determined that the communication ends, the card reader/writer 1 ends the communication with the IC card 2.

The card reader/writer 1 sends the data to the IC card 2 by using the ASK modulation in which the degree k of modulation is less than 1. The IC card 2 receives the data, performs the processing corresponding to the data, and returns the data corresponding to the processing result to the card reader/writer 1.

Next, a description is given of the reading/writing processing of the data to/from the EEPROM 66 by using the sequencer 91 of the IC card 2 shown in FIG. 3.

Figure 4:
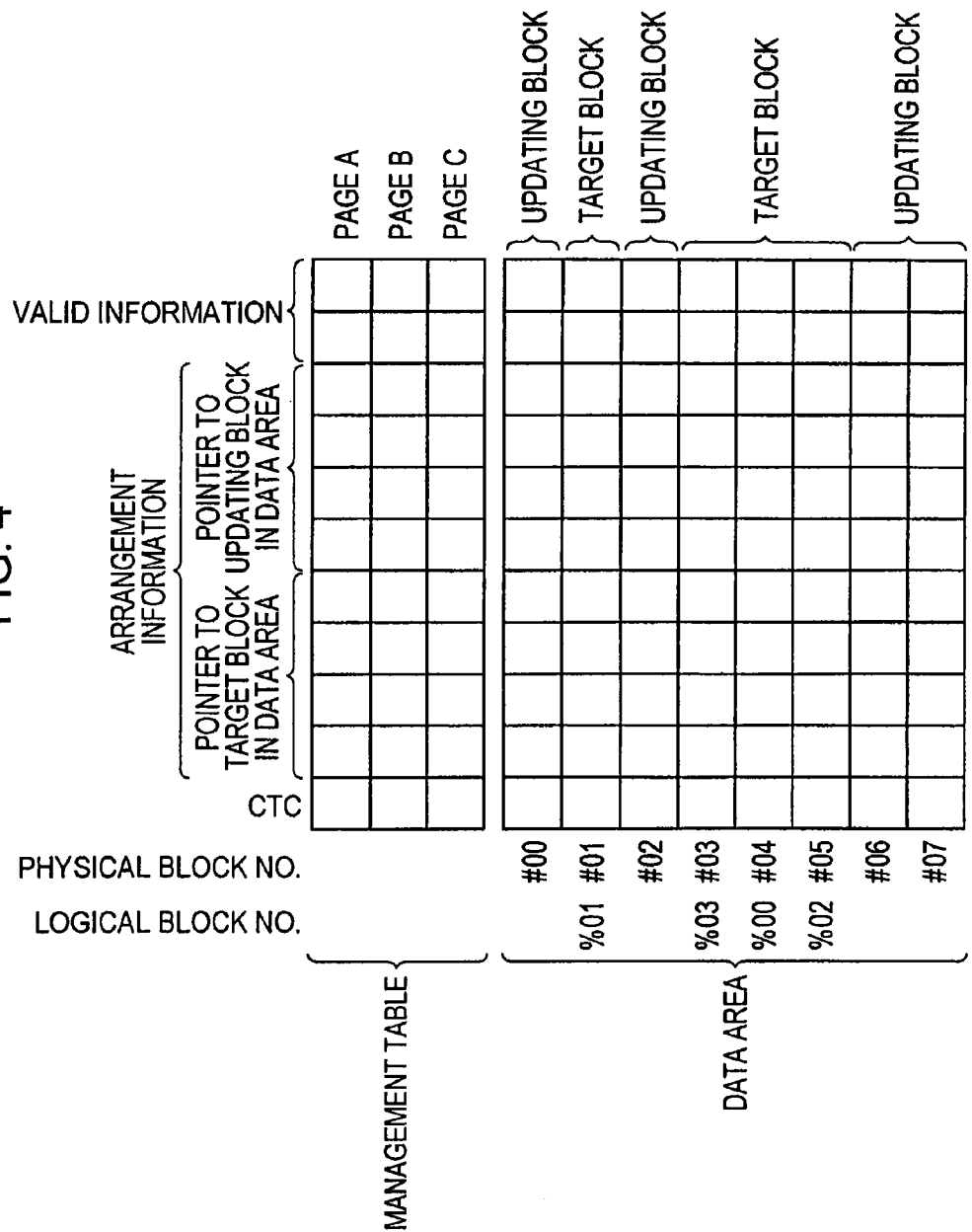
FIG. 4 is a diagram showing the schematic structure of a memory space developed to an EEPROM.

FIG. 4 schematically shows the structure of the memory space developed to the EEPROM 66. Referring to FIG. 4, the memory space comprises a physical block serving as a data area for storing the data and a physical block serving as a management table for storing the positional information of the data in the physical block comprising the data area. According to the embodiment, the management table comprises three pages A, B, and C. The physical block comprises 11 bytes, and has a physical block No. and a logical block No. In the example shown in FIG. 4, the data area comprises eight physical blocks physical block Nos. #00H to #07H. The four logical blocks are externally viewed, and the logical block has logical block Nos. % 00H to % 03H. Referring to FIG. 4, the logical block Nos. % 00H to % 03H correspond to the physical block Nos. #00H to #03H.

In the physical blocks forming the pages A and B serving as the management tables, the first one byte is assigned to the latest-information field and the final two bytes are assigned to the valid-information field. Arrangement information of the block in the data area is assigned to the field having eight bytes between the latest information and the valid information Specifically, the physical block No. of the physical block in the data area, namely, a pointer to the physical block forming the data area is written to the field of the eight bytes.

Incidentally, the latest information (CTC) denotes the latest degree of storage contents of the block, e.g., the sequential No. or the like indicating the absolute date and time. That is, in the case of using the absolute date and time, the date and time for storing the data are stored serving as the latest information, and the latest block for storing the data is detected based on the latest information of the block. In the case of using the sequential No., the number which is incremented every writing the data is stored as the latest information, and the block having the largest number is detected as the latest one.

The valid information indicates whether or not the latest information and data in the block normally ends, that is, whether or not the latest information and data is valid, and is an error correcting code such as CRC (cyclical redundancy check) or another data indicating that it is valid/invalid.

The physical block No. of the target block in the data area is arranged in the former four bytes within the field of arrangement information in the pages A and B, and the physical block No. of the updated block in the data area is arranged in the latter four bytes.

Here, the target block means the physical block serving as the original writing target in the case of writing information. As mentioned above, in the data area, when the data stored in the block B1 is rewritten with new data, the new data is written to the block B2, and the block B1 which was to be overwritten with new data corresponds to the target block. The updating block means the physical block for updating which is used for writing the information to one physical block and then updating the storage contents. That is, in the case of rewriting the data stored in the block B1 with new data, the block B2 which is used for actually writing the new data corresponds to the updating block.

The four physical block Nos. arranged in the first four bytes within the field of arrangement information in the pages A and B correspond to the logical block Nos. In the example shown in FIG. 4, the physical block Nos. arranged to the first to fourth bytes in the field of arrangement information correspond to the logical block Nos. % 00H to % 03H.

The arrangement information of the page which is valid as the management information among the pages A and B is copied to the page C serving as the remaining page of the management information. Therefore, the amount of data held by the three pages A to C is checked, thereby easily identifying which page is valid.

When the IC card 2 is apart from the card reader/writer 1 or the receiving status of the electromagnetic waves is bad due to another reason, the driving power is not sufficiently obtained. Therefore, the power is shut off during writing the data to the EEPROM 66 in the IC card 2 and then there is a problem that the writing operation does not normally end as mentioned above.

In the data area, in order to cope with the corruption of data due to a power shut-off operation, the new data is supplied and then it is written to a block different from the block storing previously written data. In this case, when a plurality of pieces of data in accordance with a plurality of blocks are written and then the data is corrupted before the end of the writing operation of the plurality of pieces of data, it is externally sensed that a plurality of pieces of old data in accordance with the logical blocks exist. Therefore, since the writing operation of the new data does not corrupt the previously written data, an unavailable status of the IC card 2 is prevented even in the worst case.

For example, the new data to be written to the block B1 is written to the block B2 different from the block B1. When the memory corruption is caused during writing the data to the block B2, the new data is not completely written and the validity is not guaranteed. However, it is possible to prevent at least the corruption of data stored in the block B1. Finally, after ending the writing operation to the block B2, the data stored in the block B1 is erased. When new data is further supplied, the data is written to a block (e.g., block B1) different from the block B2.

The management table includes the three pages A to C to solve the problem of data corruption due to the power shut-off operation upon writing the data. That is, a pair of pages A and B and each page of the pair is alternately used as the valid page or the invalid page to secure the data. Further, the valid page is copied to the page C.

In this case, when the power is shut-off during updating the page data, at the next start time, it is determined by referring to the validity and stability of the pages A to C at which step of the data writing operation to the page the power is shut off. Therefore, since the approximate restoring method at the determined data writing stage is determined, the data is restored without the corruption of a valid page.

Figure 5:
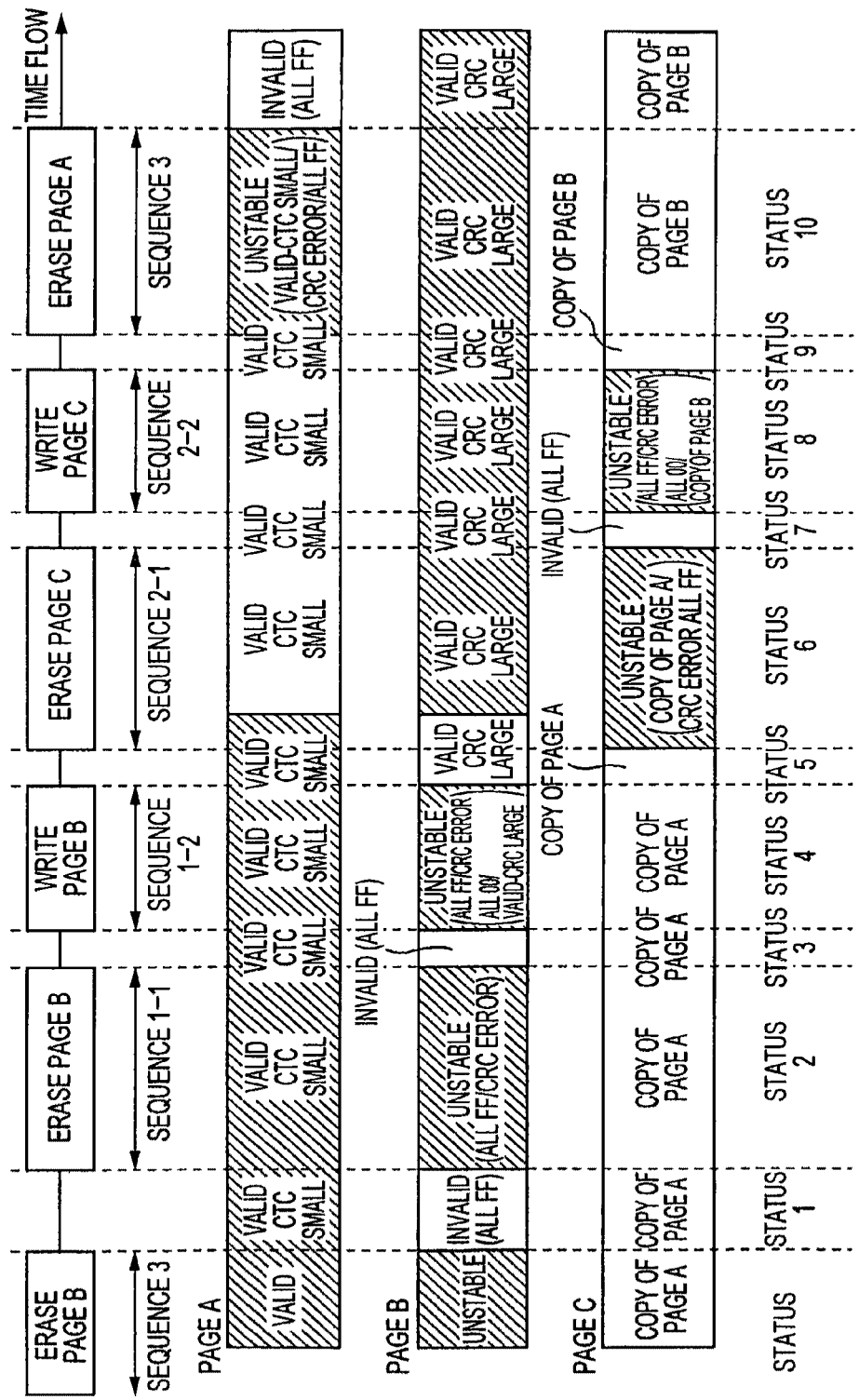
FIG. 5 is a diagram showing the switching sequence of a valid page as a management table in association with the update of a data area in a memory.

FIG. 5 shows the switching sequence of the valid page as the management table in the update of the data area in the memory.

Referring to FIG. 5, when the valid data (arrangement information) is stably written to the page A, the valid data is written to the page B in the update data area in the memory and the copy of page B is written to the page C. In accordance with the sequence, the page B is erased, the data is written to the page B, the page C is erased, the data is written to the page C, and the page A is erased, via the status transition from statuses 1 to 11 to switch the valid page.

In the status 1, the data in the page A is valid. The page B is erased in the previous stage (that is, all FF) and therefore it is invalid.

Here, the erasure of the page starts serving as the pre-process of the writing operation to the page B, and the status shifts to the status 2. In the status 2, the data of the page A is valid. The page B is in the process of erasure and therefore has an unstable value (that is, error CRC (cyclical redundancy check).

After ending the erasure of the page B, the status shifts to the status 3. In the status 3, the data of the page A is valid and the page B is invalid, namely, all FF.

After ending the erasure of the page B, the writing operation of the new data to the page B starts and the status shifts to the status 4. In the status 4, the data of the page A is valid. The page B is in the process of writing operation and therefore has an invalid value.

After ending the writing operation to the page B, the status shifts to the status 5. In the status, the data both in the pages A and B are valid.

During the statuses 1 to 5, the page A which holds the previous data is valid. Therefore, the page C maintains the stable status for storing the copy of page A.

In the status 5, the data both in the pages A and B is valid. Referring to the latest information CTC of both pages A and B, the latest information CTC of the page B is larger and thus it is determined that the page B has the latest information. Therefore, the page shifts to B from A and then the operation for copying the data of page B to the page C starts. The page copy operation comprises the erasure of page C and the writing operation to the page C.

The erasure of the page C starts serving as the pre-processing of the writing operation to the page C and then the status shifts to the status 6. In the status 6, the pages A and B are valid, however, the page C has an invalid value because the page C is in the process of erasure.

After ending the erasure of the page C, the status shifts to the status 7. In the status 7, the data both in the pages A and B are valid and the page C is invalid, namely, all FF.

Next to the end of the erasure of the page C, the operation for writing the data of the page B to the page C starts and then the status shifts to the status 8. In the status 8, the data both in the pages A and B is valid. Since the page C is in the process of writing operation, the page C has an invalid value.

After ending the writing operation to the page C, the status shifts to the status 9. In the status 9, the data in the pages A to C are valid.

At this stage, the data in the pages A and B operating as a pair of pages are valid. However, it is determined that the page A changes to be invalid by referring to the latest information CTC of the pages A and B. Therefore, the erasure of the invalid page A starts.

That is, the erasure of the page A starts and then the status shifts to the status 10. In the status 10, the pages B and C are valid and, however, the page A is in the process of erasure and has an invalid value.

After ending the erasure of the page A, the status shifts to the status 11. In the status 11, the data both in the pages B and C is valid and the page A is invalid, namely, all FF.

The data in the three pages A to C is erased and is written and the number of pieces of data held in the pages A to C is checked, thereby identifying the data in which page is valid.

When the power is shut off during updating the data in the page, at the next start time, it is determined, by referring the validity and stability of the pages A to C, at which step of the writing operation of the data to the page the power was shut off. That is, if the operation stops at any of the statuses 1 to 11 shown in FIG. 5, the pages A to C are always classified to the following statuses.

Determining Pattern 1

Any of the pages A and B is valid and stable and the copy of one of the pages A and B is written to the page C. However, the page C might be unstable.

Determining Pattern 2

The data both in the pages A and B is valid and stable. However, the page C is invalid.

(3) Determining Pattern 3

All the pages A to C are valid and, however, one of the pages A to C is unstable.

In the determining pattern 1, the copy of any of pages A and B is written to the page C and therefore it is determined that the data is interrupted until the switching to the valid page after erasure of the invalid page. Thus, it is determined that the copy of the page C is valid.

In the determining pattern 2, it is determined that the data is interrupted upon updating the copy contents of the page C. Therefore, it is determined that the page serving as the copy source, namely, one of the pages A and B having the larger latest information CTC is valid.

In the determining pattern 3, based on as whether or not the page C is equal to one of the pages A and B, it is determined just after the update of the page C starts or just before ending the update of the page C, that the data is interrupted. Therefore, it is determined that the page serving as the copy source of the page C is valid. In this case, the valid page is stable. However, one of the remaining pages is unstable, the page C is copied again by using the valid page and the invalid page is erased.

The sequence for copying one valid page of the pages A and B to the page C is added. Even when the power is shut-off during updating the management table, the data is restored without corrupting the valid page at the next start time.

FIG. 6 shows a table of the statuses upon switching the valid page as the management table and processing at the start time when the power is shut off in the statuses.

The status 1 is a start point of the writing operation of the latest data to the page B, and the valid page serving as the management table is the page A. When the power is shut off in the status 1, it is determined that the status corresponds to the determining pattern 1 and the restoring operation is not necessary at the next start time. In the status 2, the page B serving as the writing destination is erased and the page A is valid as the management table. In this case, the data in the page A is valid and the page B is unstable, and the status 2 is specifically classified into three statuses 2-1 (all FF), 2-2 (all 0), and 2-3 (CRC error). When the power is shut-off in the status 2 it is determined that the page status corresponds to the determining pattern 1 and the next start time does not need the restoring operation.

In the status 3, the erasure of the page B ends, and the page A is valid as the management table and the page B is all FF. When the power is shut-off in the status 3 it is determined that the status corresponds to the determining pattern 1, and the next start time does not need the restoring operation.

In the status 4, the page B is written and the page A is valid serving as the management table. In this case, the data in the page A is valid and the page B in the process of writing operation is unstable and the status 4 is specifically classified into four statuses 4-1 (all FF), 4-2 (all 0), 4-3 (CRC error), and 4-4 (page B is valid as the management table although unstable).

When the power is shut-off in the status 4 and the statuses 4-1 to 4-3 it is determined that the status corresponds to determining pattern 1 and the next start time does not need the restoring operation. When the power is shut-off in the status 4-4, it is determined that the status corresponds to the determining pattern 3, that is, the page C is equal to the page A. At the next start time, the page A is copied to the page C and the invalid page B is erased, thereby accomplishing the restoring operation.

In the status 5, the writing operation to the page B ends, and the data both in the pages A and B is valid and the copy of the page A is written to the page C. Thus, the page A is valid serving as the management table based on the majority decision. When the power is shut-off in the status 5 it is determined that the status corresponds to the determining pattern 3, that is, the page C is equal to the page A. At the next start time, the page A is copied to the page C and the invalid page B is erased, thereby accomplishing the restoring operation.

In the status 6, the page C is erased, the data both in the pages A and B is valid, however, the latest information CTC of the page B is large (indicating the latest data). During the status 6, a status 6-1 in which the page A is valid serving as the management table is switched to statuses 6-2 to 6-4 of the page B. In this case, the data both in the pages A and B is valid and the page C in the process of erasure is unstable and the status 6 is specifically classified into four statuses 6-1 (for holding the copy of page A), 6-2 (all 00), 6-3 (CRC error), 6-4 (all FF).

When the power is shut off in the status 6-1 it is determined that the status corresponds to the determining pattern 3, that is, the page C is equal to the page A. At the next start time, the page A is copied to the page C and the invalid page B is erased, thereby accomplishing the restoring processing. In the statuses 6-2 to 6-4, it is determined that the status corresponds to the determining pattern 2. At the next start time, the page A is compared with the page B, then, it is determined that the page B with the larger latest information CTC is valid, the page B is copied to the page C, and the invalid page A is erased, thereby accomplishing the restoring processing.

In the status 7, the erasure of page C ends and the page C is all FF. Since the data both in the pages A and B is valid, the page B with the larger latest information CTC is valid serving as the management table. When the power is shut off in the status 7 it is determined that the status corresponds to the determining pattern 2. At the next start time, the page A is compared with the page B, the page B with the larger latest information CTC is determined as a valid page, the page B is copied to the page C, and the invalid page A is erased, thereby accomplishing the restoring processing.

In the status 8, the page C is written, the data both in the pages A and B is valid, and the page B with the larger latest information CTC is valid serving as the management table. The page C in the process of writing operation is unstable and is specifically classified into four statuses 8-1 (all FF), 8-2 (all 0), 8-3 (CRC error), and 8-4 in which the data in the page B is written serving as the management table although unstable.

When the power is shut off in the status 8 and in particular statuses 8-1 to 8-3 it is determined that the statuses correspond to the determining pattern 2. At the next start time, the page A is compared with the page B, the page B with the larger latest information CTC is valid as the management table, the page B is copied to the page C, and the invalid page A is erased, thereby accomplishing the restoring processing. When the power is shut off in the status 8-4, it is determined that the status corresponds to the determining pattern 3, that is, the page C is equal to the page B. At the next start time, the page B is copied to the page C and the invalid page A is erased, thereby accomplishing the restoring processing.

In the status 9, the writing operation of the page C ends, the data both in the pages A and B is valid, and the copy of the page B is written to the page C yet, thereby determining the valid page B serving as the management table by the majority decision. When the power is shut off in the status 9, it is determined that the status corresponds to the determining pattern 3, that is, the page C is equal to the page B. At the next time, the page B is copied to the page C and the invalid page A is erased, thereby accomplishing the restoring processing.

In the status 10, the invalid page A is in the process of erasure, and the page B is valid as the management table. In this case, the data in the page B is valid, and the page A in the process of erasure is unstable and the status 10 is specifically classified into four statuses 10-1 (valid although unstable), 10-2 (all 0), 10-3 (CRC error), and 10-4 (all FF).

When the power is shut off in the status 10, in particular in the status 10-1 it is determined that the status corresponds to the determining pattern 3, that is, the page C is equal to the page B. At the next start time, the page B is copied to the page C and the invalid page A is erased, thereby accomplishing the restoring processing. When the power is shut off in the statuses 10-2 to 10-4, it is determined that the statuses correspond to the determining pattern 1 and, at the next start time, the restoring operation is not necessary.

Figure 7:
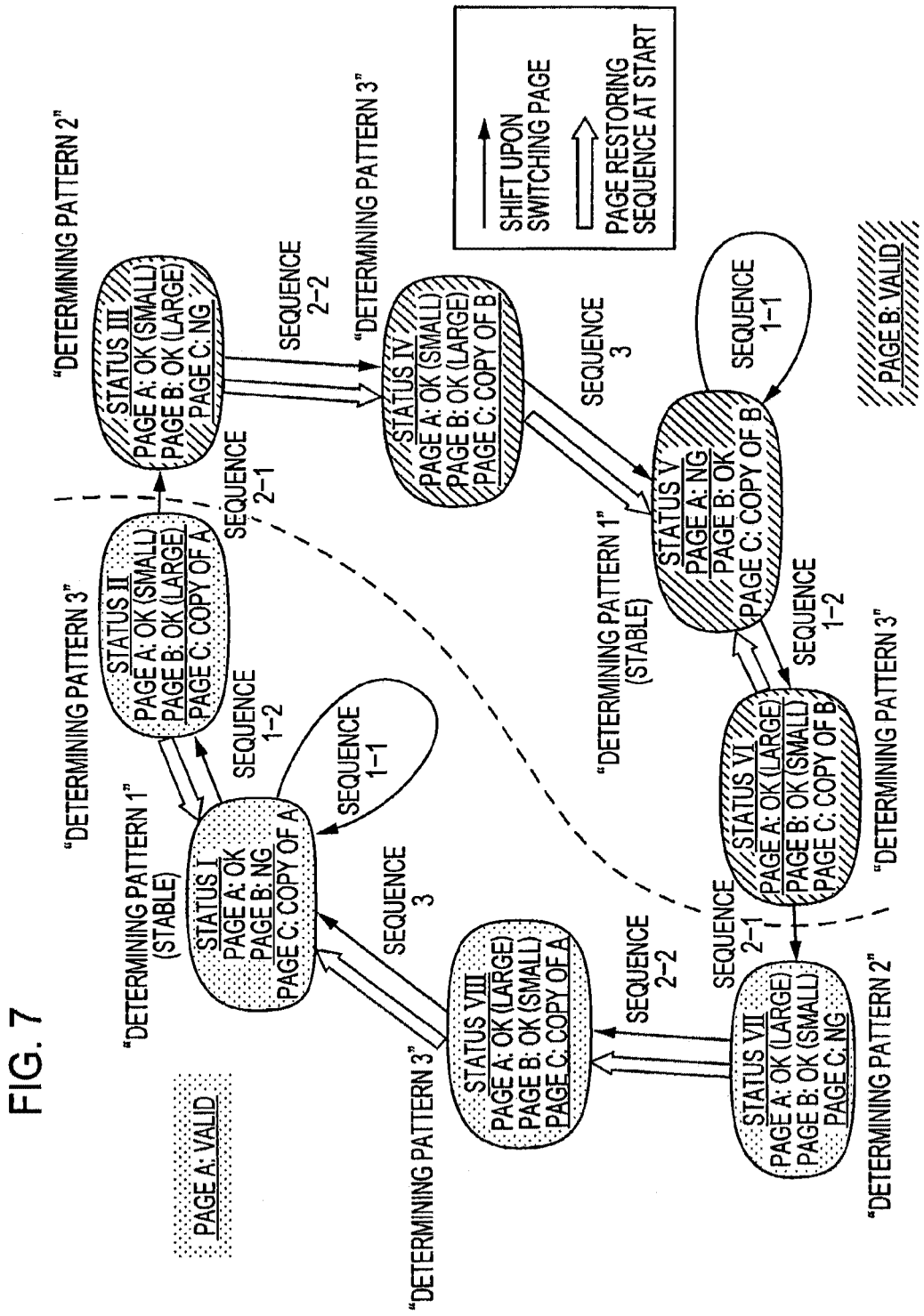
FIG. 7 is a diagram showings the status transition of the management table using the restoring operation during the normal switching processing of the management table in association with the update of the data area in the memory and when the power is shut off during the switching processing.

FIG. 7 shows the status transition of the management table using the restoring operation during the normal switching processing of the management table in association with the update of the data area in the memory and when the power is shut-off during the switching processing.

At the start time of the writing operation of page B, the page A is valid, the page B is invalid, and the page C holds the copy of page A, that is, enters a status I. During the erasure of page B, this status I keeps. When the power is shut off in the status I, it is determined that the status corresponds to the determining pattern 1 and the status does not change.

Next, the page B is written, the data both in the pages A and B is valid, and the page C holds the copy of page A, that is, shifting to a status II. When the power is shut off during the transition from the status I to the status II it is determined that the status corresponds to the determining pattern 3. The restoring processing at the next start time returns the status II to the previous status I.

Next, the page C is erased, the data both in the pages A and B is valid, and the page C is invalid, that is, the status shifts to a status III. The valid page serving as the management table is switched from the page A to the page B. When the power is shut off during the transition from the status II to the status III it is determined that the status corresponds to the determining pattern 2. The restoring processing at the next start time advances the status III to a next status IV after writing the page C.

Next, the page C is written, the data both in the pages A and B is valid, and the page C holds the copy of page B, that is, the status shifts to a status V. When the power is shut-off during the transition from the status III to the status V it is determined that the status corresponds to the determining pattern 3. The restoring processing at the next start time advances the status V to a next status VI after erasing the page A.

Next, the page A is erased, the page A is invalid, the page B is valid, and the page C holds the copy of page B, that is, the status shifts to the status VI. When the power is shut off during the transition from the status V to the status VI it is determined that the status corresponds to the determining pattern 1. The status does not change.

The status VI is the start point of the writing operation of the page A. After that, the pages A and B are inversed and the above-mentioned status transition repeats.

Figure 8:
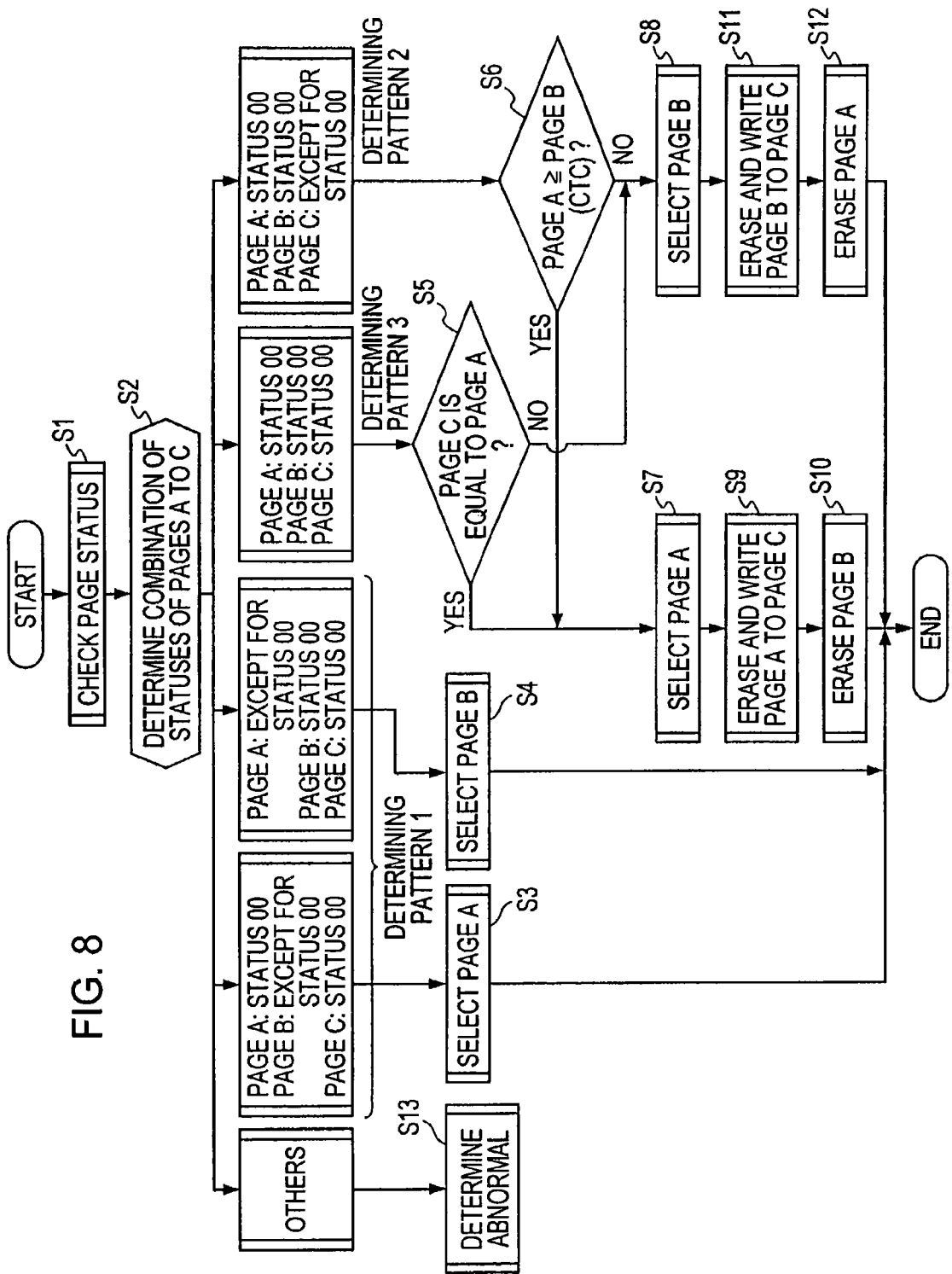
FIG. 8 is a diagram showing a flowchart for processing sequence of determining processing of the valid page as the management table and the restoring operation.
Figure 10A:
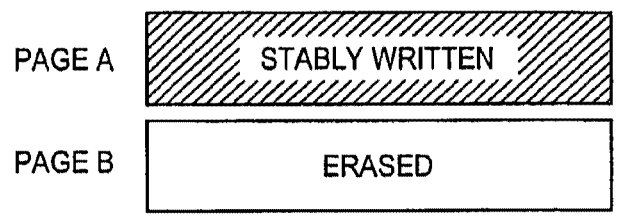
FIGS. 10A to 10C are diagrams for explaining examples of the erasing and writing operation of data in a route table having two pages.
Figure 10B:
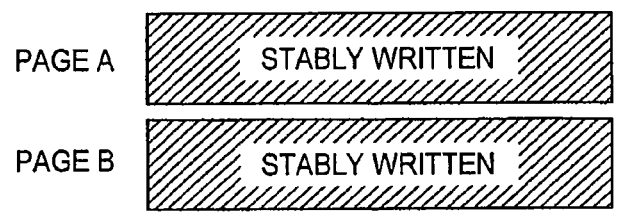
Figure 10C:
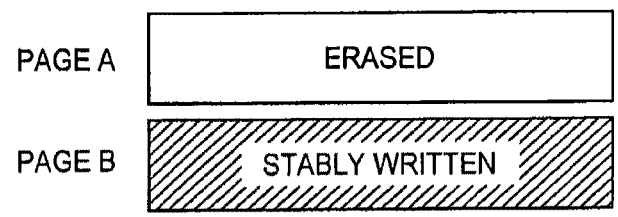
Figure 11:
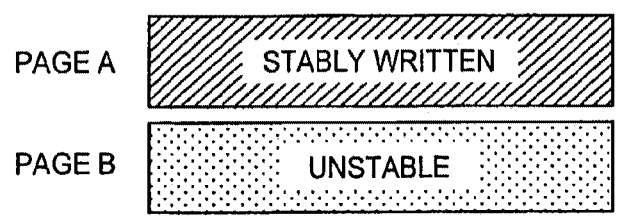
FIG. 11 is a diagram for explaining another example of the erasing and writing operation of data in the route table having the two pages.
Figure 12:
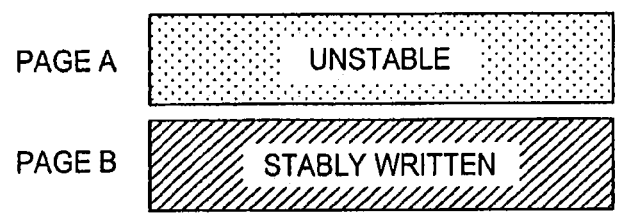
FIG. 12 is a diagram for explaining another example of the erasing and writing operation of data in the route table having the two pages.

FIG. 8 shows a flowchart for processing sequence of determining processing of the valid page as the management table and the restoring operation. The processing sequence is executed at the next start time when the power is shut off. Hereinbelow, four statuses are defined, including a status 00 in which CRC is correct (except for all 00), status 01 in which the page is all 00, status 10 in which CRC is incorrect (except for all FF), and status 11 in which the page is all FF.

First, the statuses of the pages A to C are determined (in step S1). The combination of the pages A to C is determined (in step S2).

When the page A is in the status 00, the page B is in the status except for the status 00, and the page C is in the status 00, the status is determined as the determining pattern 1 and then the page A is used as the valid page (in step S3).

When the page A is in the status except for the status 00, the page B is in the status 00, and the page C is in the status 00, the status is determined as the determining pattern 1 and then the page B is used as the valid page (in step S4).

When the page A is in the status 00, the page B is in the status 00, and the page C is in the status 00, the status is determined as the determining pattern 3. In this case, it is checked to see if the page C has the same data as the page A (in step S5). When the page C has the same data as the page A, the page A is selected as the valid page of the management table (in step S7). On the contrary, when the page C does not have the same data as the page A, the page B is selected as the valid page of the management table (in step S8).

When the page A is in the status 00, the page B is in the status 00, and the page C is in the status except for the status 00, the status is determined as the determining pattern 3. In this case, the latest information CTC is compared between the pages A and B (in step S6). When the latest information CTC of the page A is larger (that is, latest), the page A is selected as the valid page of the management table (in step S7). If not so, the page B is selected as the valid page of the management table (in step S8).

When the page A is selected as the valid page (in step S7), the page A is copied to the page C, that is, the page A is erased and written (in step S9), and the invalid page B is erased (in step S10).

When the page B is selected as the valid page (in step S8), the page B is copied to the page C, that is, the page B is erased and written (in step S11), and the invalid page A is erased (in step S12).

In the case of combination of pages A to C other than the foregoing, it is determined as abnormal (in step S13) and the entire processing routine ends.

FIG. 9 shows a flowchart for processing sequence for determining the statuses of the pages A to C in step S1 shown in FIG. 8.

First, it is checked to see if CRC of the page serving as the processing target is correct (in step S21).

When CRC of the page is correct, the page status is temporarily set to the status 00 (in step S22). Further, it is checked to see if the corresponding page is all 00 (in step S23).

When the corresponding page is all 00, the status is set to the status 01 (in step S24).

When CRC of the page is not correct (in step S21), the page status is temporarily set to the status 10 (in step S25). Further, it is checked to see if the corresponding page is all FF (in step S26).

When the corresponding page is all FF, the status is set to the status 11 (in step S27).

The embodiment of the invention referring to the accompanying drawings has been described. However, it should be understood that various changes and modifications thereof could be made by one skilled in the art without departing from the spirit or scope of the invention as defined in the appended claims.

According to the embodiment of the present invention, the data is erased and is written to the non-volatile memory in the IC card. However, the present invention is not limited to this. That is, the problem of data corruption due to the unexpected shut-off operation of power in the erasure and writing operation is not limited to the non-contact communication device such as the IC card. For example, the present invention is embodied, in the erasure and writing operation, when the external shock is suffered to a mobile phone or another information device including the non-volatile memory for erasure and writing operation and then a battery serving as a main power supply is suddenly detached and when a cartridge is detached from the device main body during the erasure and writing operation.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A device comprising:
a memory comprising a data area and a page management table of a plurality of pages for managing arrangement information of the data area, and
a controller for controlling a data writing operation to the memory for writing data after erasure thereof, and for determining a page, of the plurality of pages, for holding valid arrangement information in accordance with a combination of statuses of said plurality of pages,
wherein the plurality of pages includes a first page, a second page, and a third page, and
wherein the controller starts a restoring operation of the data in the page corresponding to the data writing stage at the occurrence time of power shut-off operation, and when one of said first and second pages is valid and stable and a copy of a valid one of said first and second pages is written to said third page, determining that the data is interrupted at a stage from an erasure of an invalid one of said first and second pages to a rewriting operation to the valid page, and determining that one of said first and second pages whose copy is written to said third page is valid and restores the valid page.

2. An information processing device for controlling a data writing operation to a memory for writing data after erasure thereof, wherein said memory comprises a management table comprising first, second, and third pages for managing arrangement information of a data area, and said information processing device comprises:

a processor; and a storage device storing instructions which when executed by the processor, causes the processor to:

erase and write valid arrangement information into one of said first and second pages in accordance with a data update of the data area;

determine whether or not said first and second pages are valid based on a combination of statuses of said first, second, and third pages;

erase said third page and write, to said third page data in a page that is determined as valid; and erase a page that is determined as invalid, wherein said instructions cause the processor to start a restoring operation of the data in the page corresponding to the data writing stage at the occurrence time of power shut-off operation, and wherein, when one of said first and second pages is valid and stable and a copy of a valid one of said first and second pages is written to said third page, said instructions cause the processor to determine that the data is interrupted at a stage from an erasure of an invalid one of said first and second pages to a rewriting operation to the valid page, and determine that one of said first and second pages whose copy is written to said third page is valid and restores the valid page.

3. An information processing device according to claim 2, wherein, when one of said first and second pages stores valid arrangement information, said instructions cause the processor to erase the invalid page and write new arrangement information to the invalid page of said first and second pages in response to the data update of the data area.

4. An information processing device according to claim 2, wherein said first and second pages have a latest-information field indicating whether or not the storage contents thereof are latest and a valid-information field indicating whether or not the data writing operation of arrangement information and the latest information normally ends, and said instructions cause the processor to determine which page is valid as a management table by referring to the latest-information field and the valid-information field of said first and second pages.

5. An information processing method for controlling a data writing operation to a memory for writing data after erasure thereof, wherein said memory comprises a management table comprising first, second, and third pages for managing arrangement information of a data area, and said information processing method comprising:

updating a page including erasing and writing with valid arrangement information one of said first and second pages in accordance with a data update of the data area;

determining a valid page based on a combination of statuses of said first, second, and third pages including determining whether or not said first and second pages are valid;

copying a page including erasing and writing, to said third page, data in a page that is determined as a valid page;

erasing a page including erasing a page that is determined as an invalid page; and commencing a restoring operation of the data in the page corresponding to the data writing stage at the occurrence time of power shut-off operation, wherein, when one of said first and second pages is valid and stable and a copy of a valid one of said first and second pages is written to said third page, it is determined that the data is interrupted at the stage from the erasure of an invalid page of said first and second pages to a rewriting operation to the valid page, and wherein, it is determined that one of said first and second pages whose copy is written to said third page is valid and the valid one of said first and second pages is copied.

6. An information processing method according to claim 5, wherein said first and second pages have a latest-information field indicating whether or not the storage contents thereof are latest and a valid-information field indicating whether or not the data writing operation of arrangement information and the latest information normally ends, and wherein, it is determined which page is valid as a management table by referring to the latest-information field and the valid-information field of said first and second pages.

7. An information processing method for controlling a data writing operation to a memory for writing data after erasure thereof, wherein said memory comprises a management table comprising first, second, and third pages for managing arrangement information of a data area, and said information processing method comprising:

updating a page including erasing and writing with valid arrangement information one of said first and second pages in accordance with a data update of the data area;

determining a valid page based on a combination of statuses of said first, second, and third pages including determining whether or not said first and second pages are valid;

copying a page including erasing and writing, to said third page, data in a page that is determined as a valid page;

erasing a page including erasing a page that is determined as an invalid page; and commencing a restoring operation of the data in the page corresponding to the data writing stage at the occurrence time of power shut-off operation, wherein, when both said first and second pages are valid and stable and said third page is invalid, it is determined that the data is interrupted at the stage of erasing the data of said third page, and wherein, it is determined that the page determined as a valid page by said valid page determining step is valid among said first and second pages, and restores the valid page.

8. An information processing method according to claim 7, wherein said first and second pages have a latest-information field indicating whether or not the storage contents thereof are latest and a valid-information field indicating whether or not the data writing operation of arrangement information and the latest information normally ends, and wherein, it is determined which page is valid as a management table by referring to the latest-information field and the valid-information field of said first and second pages.

9. An information processing method for controlling a data writing operation to a memory for writing data after erasure thereof, wherein said memory comprises a management table comprising first, second, and third pages for managing arrangement information of a data area, and said information processing method comprising:

updating a page including erasing and writing with valid arrangement information one of said first and second pages in accordance with a data update of the data area;

determining a valid page based on a combination of statuses of said first, second, and third pages including determining whether or not said first and second pages are valid;

copying a page including erasing and writing, to said third page, data in a page that is determined as a valid page;

erasing a page including erasing a page that is determined as an invalid page; and commencing a restoring operation of the data in the page corresponding to the data writing stage at the occurrence time of power shut-off operation, wherein, it is determined based on which one of said first and second pages said third page is equal to when both said first and second pages are valid and one of said first and second pages is unstable, the data is interrupted just after starting the update of said third page or just before the end of update thereof, and wherein, the page determined as a valid page by said page determining step among said first and second pages is copied to said third page, and the page determined as an invalid one of said first and second pages is erased.

10. An information processing method according to claim 9, wherein said first and second pages have a latest-information field indicating whether or not the storage contents thereof are latest and a valid-information field indicating whether or not the data writing operation of arrangement information and the latest information normally ends, and wherein, it is determined which page is valid as a management table by referring to the latest-information field and the valid-information field of said first and second pages.

11. A non-transitory computer readable storage medium storing a computer program for executing processing for controlling a data writing operation to a memory for a writing operation after erasure thereof on a computer system, wherein said memory comprises a management table comprising first, second, and third pages for managing arrangement information of a data area, and said computer program comprising:
   a page updating step of erasing and writing with valid arrangement information one of said first and second pages in accordance with the data update of the data area;
   a valid page determining step of determining whether or not said first and second pages are valid based on a combination of statuses of said first, second, and third pages;
   a page copying step of erasing said third page and writing, to said third page, data in a page that is determined as a valid page by said valid page determining step; and
   a page erasing step of erasing a page that is determined as an invalid page by said valid page determining step;
   a restoring step of commencing a restoring operation of the data in the page corresponding to the data writing stage at the occurrence time of power shut-off operation, wherein, when both said first and second pages are valid and stable and said third page is invalid, it is determined that the data is interrupted at the stage of erasing the data of said third page, and wherein, it is determined that the page determined as a valid page by said valid page determining step is valid among said first and second pages, and restores the valid page.

12. A device according to claim 1, wherein each of the plurality of pages in the page management table is used to store a pointer to a target block in the data area and a pointer to an updating block in the data area.

13. A device comprising:
   a memory comprising a data area and a page management table of a plurality of pages for managing arrangement information of the data area, and
   a controller for controlling a data writing operation to the memory for writing data after erasure thereof, and for determining a page, of the plurality of pages, for holding valid arrangement information in accordance with a combination of statuses of said plurality of pages,
   wherein the plurality of pages includes a first page, a second page, and a third page, and
   wherein the controller starts a restoring operation of the data in the page corresponding to the data writing stage at the occurrence time of power shut-off operation, and when one of said first and second pages is valid and stable and said third page is invalid, determines that the data is interrupted at the stage of erasing the data to said third page, and determines that the page determined as a valid page is valid among said first and second pages, and restores the valid page.

14. A device according to claim 13, wherein each of the plurality of pages in the page management table is used to store a pointer to a target block in the data area and a pointer to an updating block in the data area.

15. A device comprising:
   a memory comprising a data area and a page management table of a plurality of pages for managing arrangement information of the data area, and
   a controller for controlling a data writing operation to the memory for writing data after erasure thereof, and for determining a page, of the plurality of pages, for holding valid arrangement information in accordance with a combination of statuses of said plurality of pages,
   wherein the plurality of pages includes a first page, a second page, and a third page, and
   wherein the controller starts a restoring operation of the data in the page corresponding to the data writing stage at the occurrence time of power shut-off operation, and determines which one of said first and second pages said third page is equal to when both said first and second pages are valid and one of said first and second pages is unstable, the data is interrupted just after starting the update of said third page or just before the end of update thereof, and copies, to said third page, the page determined as a valid page among said first and second pages, and erases the page determined as an invalid one of said first and second pages.

16. A device according to claim 15, wherein each of the plurality of pages in the page management table is used to store a pointer to a target block in the data area and a pointer to an updating block in the data area.

17. An information processing device for controlling a data writing operation to a memory for writing data after erasure thereof, wherein said memory comprises a management table comprising first, second, and third pages for managing arrangement information of a data area, and said information processing device comprises:
   a processor; and
   a storage device storing instructions which when executed by the processor, causes the processor to:
   erase and write valid arrangement information into one of said first and second pages in accordance with a data update of the data area;
   determine whether or not said first and second pages are valid based on a combination of statuses of said first, second, and third pages;
   erase said third page and write, to said third page data in a page that is determined as valid; and
   erase a page that is determined as invalid,
   wherein said instructions cause the processor to start a restoring operation of the data in the page corresponding to the data writing stage at the occurrence time of power shut-off operation, and wherein, when one of said first and second pages is valid and stable and said third page is invalid, said instructions cause the processor to determine that the data is interrupted at the stage of erasing the data to said third page, and determine that the page determined as a valid page is valid among said first and second pages, and restore the valid page.

18. An information processing device according to claim 17, wherein, when one of said first and second pages stores valid arrangement information, said instructions cause the processor to erase the invalid page and write new arrangement information to the invalid page of said first and second pages in response to the data update of the data area.

19. An information processing device according to claim 17, wherein said first and second pages have a latest-information field indicating whether or not the storage contents thereof are latest and a valid-information field indicating whether or not the data writing operation of arrangement information and the latest information normally ends, and said instructions cause the processor to determine which page is valid as a management table by referring to the latest-information field and the valid-information field of said first and second pages.

20. An information processing device for controlling a data writing operation to a memory for writing data after erasure thereof, wherein said memory comprises a management table comprising first, second, and third pages for managing arrangement information of a data area, and said information processing device comprises:
  a processor; and
  a storage device storing instructions which when executed by the processor, causes the processor to:
  erase and write valid arrangement information into one of said first and second pages in accordance with a data update of the data area;
  determine whether or not said first and second pages are valid based on a combination of statuses of said first, second, and third pages;
  erase said third page and write, to said third page data in a page that is determined as valid; and
  erase a page that is determined as invalid,
  wherein said instructions cause the processor to start a restoring operation of the data in the page corresponding to the data writing stage at the occurrence time of power shut-off operation, and
  wherein said instructions cause the processor to determine which one of said first and second pages said third page is equal to when both said first and second pages are valid and one of said first and second pages is unstable, the data is interrupted just after starting the update of said third page or just before the end of update thereof, and said instructions cause the processor to copy, to said third page, the page determined as a valid page among said first and second pages, and erase the page determined as an invalid one of said first and second pages.

21. An information processing device according to claim 20, wherein, when one of said first and second pages stores valid arrangement information, said instructions cause the processor to erase the invalid page and write new arrangement information to the invalid page of said first and second pages in response to the data update of the data area.

22. An information processing device according to claim 20, wherein said first and second pages have a latest-information field indicating whether or not the storage contents thereof are latest and a valid-information field indicating whether or not the data writing operation of arrangement information and the latest information normally ends, and said instructions cause the processor to determine which page is valid as a management table by referring to the latest-information field and the valid-information field of said first and second pages.

23. A non-transitory computer readable storage medium storing a computer program for executing processing for controlling a data writing operation to a memory for a writing operation after erasure thereof on a computer system,
  wherein said memory comprises a management table comprising first, second, and third pages for managing arrangement information of a data area, and said computer program comprising:
    a page updating step of erasing and writing with valid arrangement information one of said first and second pages in accordance with the data update of the data area;
    a valid page determining step of determining whether or not said first and second pages are valid based on a combination of statuses of said first, second, and third pages;
    a page copying step of erasing said third page and writing, to said third page, data in a page that is determined as a valid page by said valid page determining step;
    a page erasing step of erasing a page that is determined as an invalid page by said valid page determining step; and
    a restoring step of commencing a restoring operation of the data in the page corresponding to the data writing stage at the occurrence time of power shut-off operation,
  wherein, when both said first and second pages are valid and stable and said third page is invalid, it is determined that the data is interrupted at the stage of erasing the data of said third page, and wherein, it is determined that the page determined as a valid page by said valid page determining step is valid among said first and second pages, and restores the valid page.

24. A non-transitory computer readable storage medium storing a computer program for executing processing for controlling a data writing operation to a memory for a writing operation after erasure thereof on a computer system,
  wherein said memory comprises a management table comprising first, second, and third pages for managing arrangement information of a data area, and said computer program comprising:
    a page updating step of erasing and writing with valid arrangement information one of said first and second pages in accordance with the data update of the data area;
    a valid page determining step of determining whether or not said first and second pages are valid based on a combination of statuses of said first, second, and third pages;
    a page copying step of erasing said third page and writing, to said third page, data in a page that is determined as a valid page by said valid page determining step;
    a page erasing step of erasing a page that is determined as an invalid page by said valid page determining step; and
    a restoring step of commencing a restoring operation of the data in the page corresponding to the data writing stage at the occurrence time of power shut-off operation,
  wherein, when both said first and second pages are valid and stable and said third page is invalid, it is determined that the data is interrupted at the stage of erasing the data of said third page, and wherein, it is determined that the page determined as a valid page by said valid page determining step is valid among said first and second pages, and restores the valid page.

* * * * *